(12) United States Patent
Fukuda et al.

(10) Patent No.: US 7,609,064 B2
(45) Date of Patent: Oct. 27, 2009

(54) PROBE CONFIGURED FOR NMR APPARATUS AND NMR APPARATUS USING THE SAME

(75) Inventors: Yuzo Fukuda, Hitachi (JP); Kazuo Saitoh, Kodaira (JP); Hiroyuki Yamamoto, Kokubunji (JP); Michiya Okada, Mito (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/757,453

(22) Filed: Jun. 4, 2007

(65) Prior Publication Data
US 2008/0061786 A1    Mar. 13, 2008

(30) Foreign Application Priority Data
May 6, 2006    (JP) .............. 2006-155971

(51) Int. Cl.
G01V 3/00    (2006.01)

(52) U.S. Cl. ............... 324/322; 324/318; 324/315; 324/307

(58) Field of Classification Search ......... 324/300–322; 600/410, 422; 361/141, 146
See application file for complete search history.

(56) References Cited

U.S. PATENT DOCUMENTS

| | | | | |
|---|---|---|---|---|
| 3,430,128 | A * | 2/1969 | Lovins | 324/322 |
| 4,535,291 | A * | 8/1985 | Lee et al. | 324/320 |
| 4,769,602 | A * | 9/1988 | Vinegar et al. | 324/303 |
| 4,816,962 | A * | 3/1989 | Yamada et al. | 361/141 |
| 5,276,399 | A * | 1/1994 | Kasten et al. | 324/319 |
| 5,650,903 | A * | 7/1997 | Gross et al. | 361/141 |
| 5,835,995 | A * | 11/1998 | Macovski et al. | 324/309 |
| 5,898,306 | A * | 4/1999 | Liu et al. | 324/322 |
| 6,201,395 | B1 * | 3/2001 | Stanley | 324/322 |
| 6,414,488 | B1 * | 7/2002 | Chmielewski | 324/311 |
| 6,900,638 | B1 * | 5/2005 | Yair et al. | 324/322 |
| 7,081,753 | B2 * | 7/2006 | Mullen et al. | 324/318 |
| 7,180,291 | B2 * | 2/2007 | Chmielewski et al. | 324/318 |
| 7,190,165 | B2 * | 3/2007 | Hammond et al. | 324/318 |
| 7,221,162 | B2 * | 5/2007 | Feiweier et al. | 324/318 |
| 7,227,360 | B2 * | 6/2007 | Jevtic et al. | 324/318 |
| 7,265,549 | B2 * | 9/2007 | Alvarez et al. | 324/310 |

(Continued)

FOREIGN PATENT DOCUMENTS

JP    04-015904 U    2/1992

(Continued)

OTHER PUBLICATIONS

Japanese Office Action issued in corresponding Japanese Patent Application No. 2006-155971 on Sep. 9, 2008.

Primary Examiner—Brij B. Shrivastav
Assistant Examiner—Tiffany A Fetzner
(74) Attorney, Agent, or Firm—Antonelli, Terry, Stout & Kraus, LLP.

(57) ABSTRACT

A probe for a nuclear magnetic resonance apparatus comprises: a transmission coil for irradiating a sample with a high-frequency electromagnetic wave; and a receiving coil for detecting a nuclear magnetic resonance signal emitted by the sample, wherein a selector switch is disposed to the transmission coil to reduce the deterioration of sensitivity of the receiving coil by switching the resonance state of the transmission circuit between during irradiation and during detection, even if an electromagnetic coupling remains between transmission and reception.

12 Claims, 5 Drawing Sheets

U.S. PATENT DOCUMENTS

| | | | |
|---|---|---|---|
| 7,265,550 B2 * | 9/2007 | Laubacher et al. | 324/318 |
| 7,279,896 B2 * | 10/2007 | Alvarez et al. | 324/310 |
| 7,279,897 B2 * | 10/2007 | Alvarez et al. | 324/310 |
| 7,332,910 B2 * | 2/2008 | Laubacher et al. | 324/318 |
| 7,388,377 B2 * | 6/2008 | Alvarez et al. | 324/311 |
| 2005/0140369 A1 * | 6/2005 | Feiweier et al. | 324/318 |
| 2005/0189943 A1 * | 9/2005 | Hammond et al. | 324/318 |
| 2005/0248345 A1 * | 11/2005 | Alvarez et al. | 324/310 |
| 2005/0258831 A1 * | 11/2005 | Alvarez et al. | 324/310 |
| 2005/0264289 A1 * | 12/2005 | Alvarez et al. | 324/310 |
| 2006/0012371 A1 * | 1/2006 | Laubacher et al. | 324/322 |
| 2006/0017438 A1 * | 1/2006 | Mullen et al. | 324/318 |
| 2006/0033497 A1 * | 2/2006 | Chmielewski et al. | 324/318 |
| 2006/0119357 A1 * | 6/2006 | Alvarez et al. | 324/311 |
| 2006/0158187 A1 * | 7/2006 | Jevtic et al. | 324/318 |
| 2007/0176600 A1 * | 8/2007 | Laubacher et al. | 324/300 |
| 2008/0061786 A1 * | 3/2008 | Fukuda et al. | 324/322 |
| 2008/0129291 A1 * | 6/2008 | Schiano et al. | 324/311 |

FOREIGN PATENT DOCUMENTS

JP    2002-207072    7/2002

* cited by examiner

PROBE CONFIGURED FOR NMR APPARATUS AND NMR APPARATUS USING THE SAME

BACKGROUND OF THE INVENTION

The present invention relates to a probe for use in a nuclear magnetic resonance (NMR) apparatus and the nuclear magnetic resonance apparatus equipped with the probe.

The nuclear magnetic resonance (NMR) apparatus irradiates a sample which is placed in a static magnetic field formed by a magnet with a high frequency electromagnetic wave, and detects a nuclear magnetic resonance signal emitted by the sample. The nuclear magnetic resonance apparatus is considered to be appropriate for the analysis of molecular structures. In the nuclear magnetic resonance apparatus, a probe coil has both a role for irradiating the sample with a high frequency magnetic field and a role for detecting the signal emitted by the sample. The irradiation is performed by a transmission coil, and the detection is performed by a receiving coil. A single coil may be used to perform both the transmission and reception. Alternatively, they may be performed by separate coils. In both cases, it is desirable that the magnetic field produced by the transmission coil is uniform in the region surrounding the sample during irradiation, and that the receiving coil is capable of efficiently receiving a signal during detection.

When a single coil plays both roles for transmission and reception, one tuning and matching circuit is required for one transmission/receiving coil. Tow or more capacitors for adjusting resonance frequency and for matching impedance are disposed in the tuning and mating circuit. Since one coil is provided, one set of the circuits for performing matching is sufficient. However, an additional switching circuit is needed for switching the connection to a transmitter and to a receiver. A method of performing the transmission and reception with a single coil through the use of such a switching circuit is described in JP-A-2002-207072 (Claims).

In contrast, when separate coils are used to perform the transmission and reception (irradiation and detection), two coils for transmission and reception are provided respectively. Therefore, two sets of tuning and matching circuits are required. This method enables the shape of each coil to be optimized independently, thus providing advantages over the single coil in various ways. For example, a coil that employs a superconductor reduces resistance, thus being able to enhance a Q (Quality-factor) value of resonance and thereby to improve sensitivity. However, in the type having separate coils for transmission and reception respectively, there arises a problem that signal detection sensitivity of the receiving coil is deteriorated due to an electromagnetic coupling between the two coils. Conventionally, such a problem has been solved by precisely disposing the coils in such a way that magnetic fields generated by each coil are perpendicular with each other, or by reducing a coupling that slightly remains through fine-tuning of the relative positions of the coils in a trial and error manner.

SUMMARY OF THE INVENTION

A method of enhancing the sensitivity of the NMR apparatus includes cooling the probe coil, which has conventionally been employed to reduce the coupling between coils. However, it is difficult to apply this method to the transmission and reception separation type probe coil, because in order to cool the probe coil, the probe coil must be placed in a vacuum insulated container. Under such an environment, it is quite difficult to directly contact and fine-tune the probe coil from outside. Furthermore, performance of the fine-tuning cannot be expected from the viewpoint of securing a heat transfer path with small resistance for cooling.

It is an object of the present invention to provide a probe for an NMR that is capable of reducing an influence from an electromagnetic coupling, if any, between a transmission coil and a receiving coil to derive detection efficiency inherent to the receiving coil, and to provide an NMR apparatus equipped with the same.

The present invention is characterized in that the probe for a nuclear magnetic resonance apparatus comprises a transmission coil for irradiating a sample with a high frequency electromagnetic wave and a receiving coil for detecting a nuclear magnetic resonance signal emitted by the sample, wherein the transmission coil is provided with a selector switch.

With the disposition of a selector switch at a transmission coil the transmission and reception separation type probe, it is possible to switch the resonance state of a transmission circuit between during irradiation and during detection, and to reduce deterioration of sensitivity of the receiving coil even if there remains an electromagnetic coupling between the transmission and reception.

A superconductor or a semiconductor device can be employed for the selector switch. The superconductor and semiconductor device are quite preferable. The selector switch can be inserted in series or in parallel with the transmission coil. When the selector switch is inserted in series with the transmission coil, it is configured to operate to switch to an ON state during irradiation and to switch to an OFF state during reception. When the switch is inserted in parallel with the transmission coil, it is configured to operate to switch to an OFF state during irradiation and to switch to an ON state during reception.

The selector switch employing the superconductor desirably switches in a passive manner according to a transmission state or a reception state using a critical current as a threshold. Alternatively, it desirably switches in an active manner according to a temperature rise caused by heater heating. Furthermore, it is desirable that a current for controlling heater heating operates to be in an ON state during normal time and transmission and to be in an OFF state only during normal time and an operation to switch to reception, and causes the selector switch to operate to switch to an ON state during normal time and transmission and to switch to an OFF state during reception.

The present invention is characterized in that a nuclear magnetic resonance (NMR) apparatus irradiates a sample placed in a static magnetic field formed by a magnet with a high frequency electromagnetic wave from a coil of the transmission and reception separation type probe, and detects a nuclear magnetic resonance signal emitted by the sample, wherein the probe comprises a transmission coil for irradiating the sample with a high frequency electromagnetic wave and a receiving coil for detecting a nuclear magnetic resonance signal emitted by the sample, and the transmission coil has a selector switch.

According to the present invention, it is possible to reduce energy waste caused by the transmission coil, to derive the detection efficiency the transmission coil originally has, and to perform a highly sensitive NMR measurement.

Other objects, features and advantages of the invention will become apparent from the following description of the embodiments of the invention taken in conjunction with the accompanying drawings.

DESCRIPTION OF THE EMBODIMENTS

Hereinafter, embodiments of the present invention will be described with reference to the accompanying drawings. It should be noted, however, that the present invention is not limited thereto.

Embodiment 1

Figure 1:
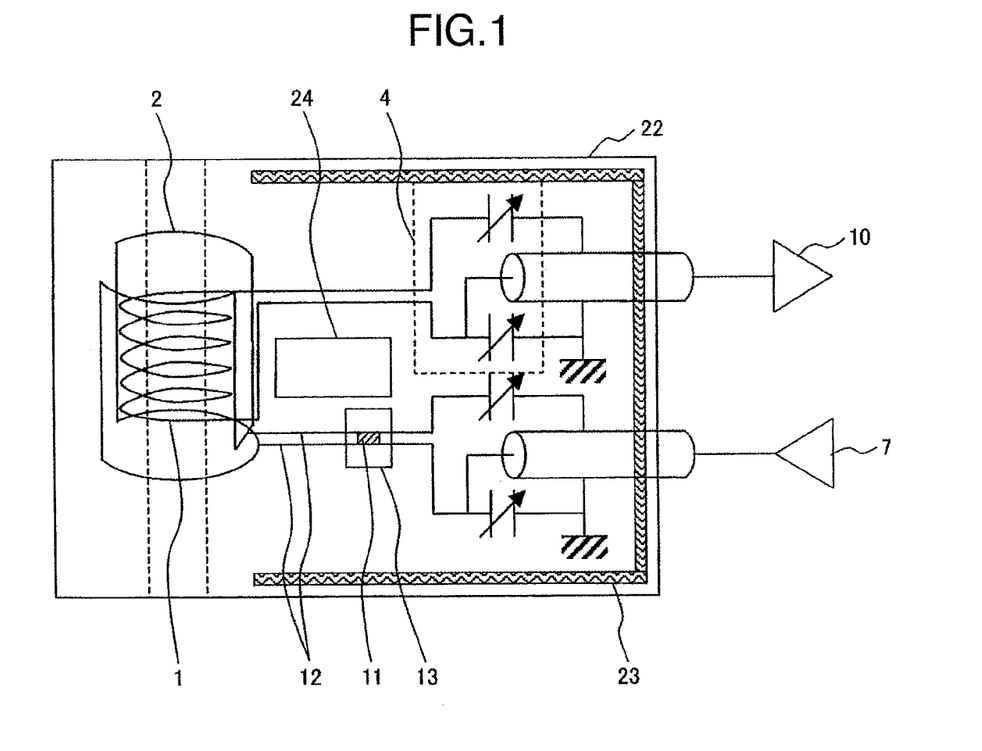
FIG. 1 is a schematic diagram showing an embodiment of a probe according to the present invention.
Figure 2:
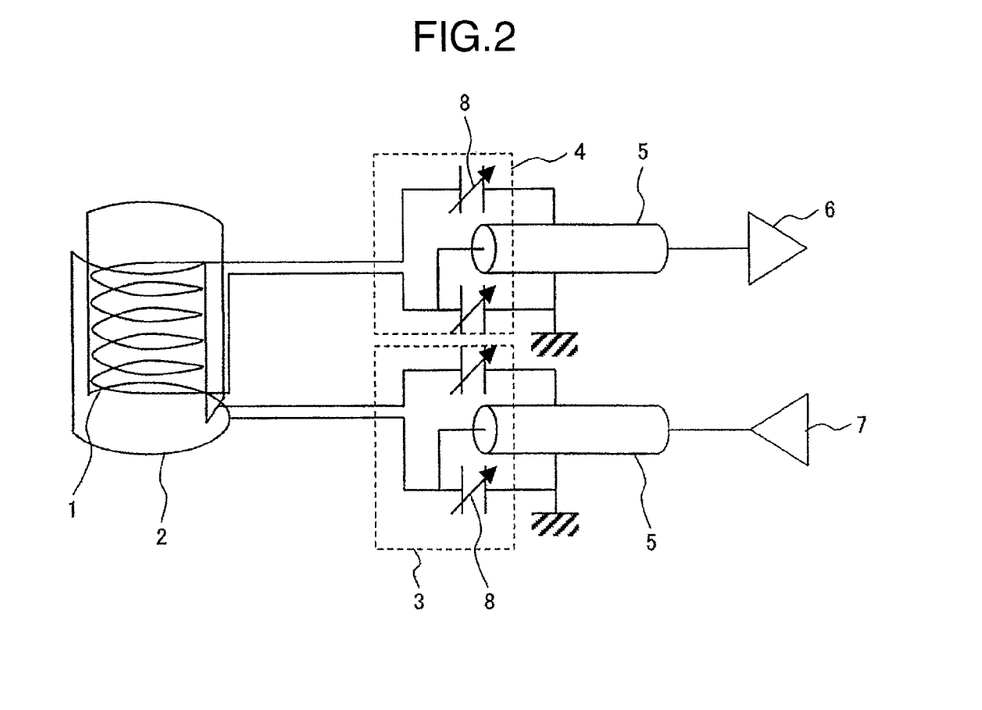
FIG. 2 is a diagram of the probe using transmission/reception different coils type probe coil.

A schematic diagram of a probe for a nuclear magnet resonance apparatus (NMR) according to the present invention is shown in FIG. 1, and a magnified diagram of probe coil is shown in FIG. 2. The probe coil is structured in a transmission and reception separation type and comprises a receiving coil 1 and a transmission coil 2. Unlike a transmission and reception combined type, the transmission and reception separation type does not require a switching circuit for switching the connection to a transmitter 6 and a receiver 7. It is desirable that the receiving coil 1 has optimized sensitivity, and the transmission coil 2 is excellent in uniformizing the irradiated magnetic field. Enhancing Q value is effective for increasing the sensitivity of the receiving coil, and the receiving coil that employs a superconductor in order to prevent a loss from occurring at the coil will become more sensitive. Cooling the coil comprised of a metal or the like also reduces resistance to improve the Q value, resulting in improved sensitivity. The receiving coil 1 is provided with a tuning and matching circuit 4, and the transmission coil is provided with a tuning and matching circuit 3. Moreover, the tuning and matching circuits 3 and 4 are provided with two each of variable capacitor 8 for tuning resonance frequency and matching impedance. The tuning and matching circuit 4 is connected to the receiver 6, while the tuning and matching circuit 3 is connected to a transmitter 8 through a coaxial cable 5. It should be noted that in a typical receiver structure, a preliminary amplifier 10 is disposed at the front stage.

The probe coil is cooled to enhance the sensitivity thereof, and the interior of a probe container 22 is kept in vacuum for the purpose of cooling. Cooling the probe coil would be effective in reducing thermal noise and improving the resonance Q-value, and leads to improved sensitivity. In order to achieve a sufficient cooling effect, the probe coil is cooled to the temperature of 40K or below. In order to perform more stable cooling, it is desirable that a thermal radiation shield 23 having its own cooling source or a laminated heat simulation material is disposed in a vacuum to prevent heat transfer from the probe container 22 with an ambient temperature to a coil portion or a circuit portion by radiation or the like. A heat exchanger 24 for cooling purposes is disposed around the probe coil.

Figure 5:
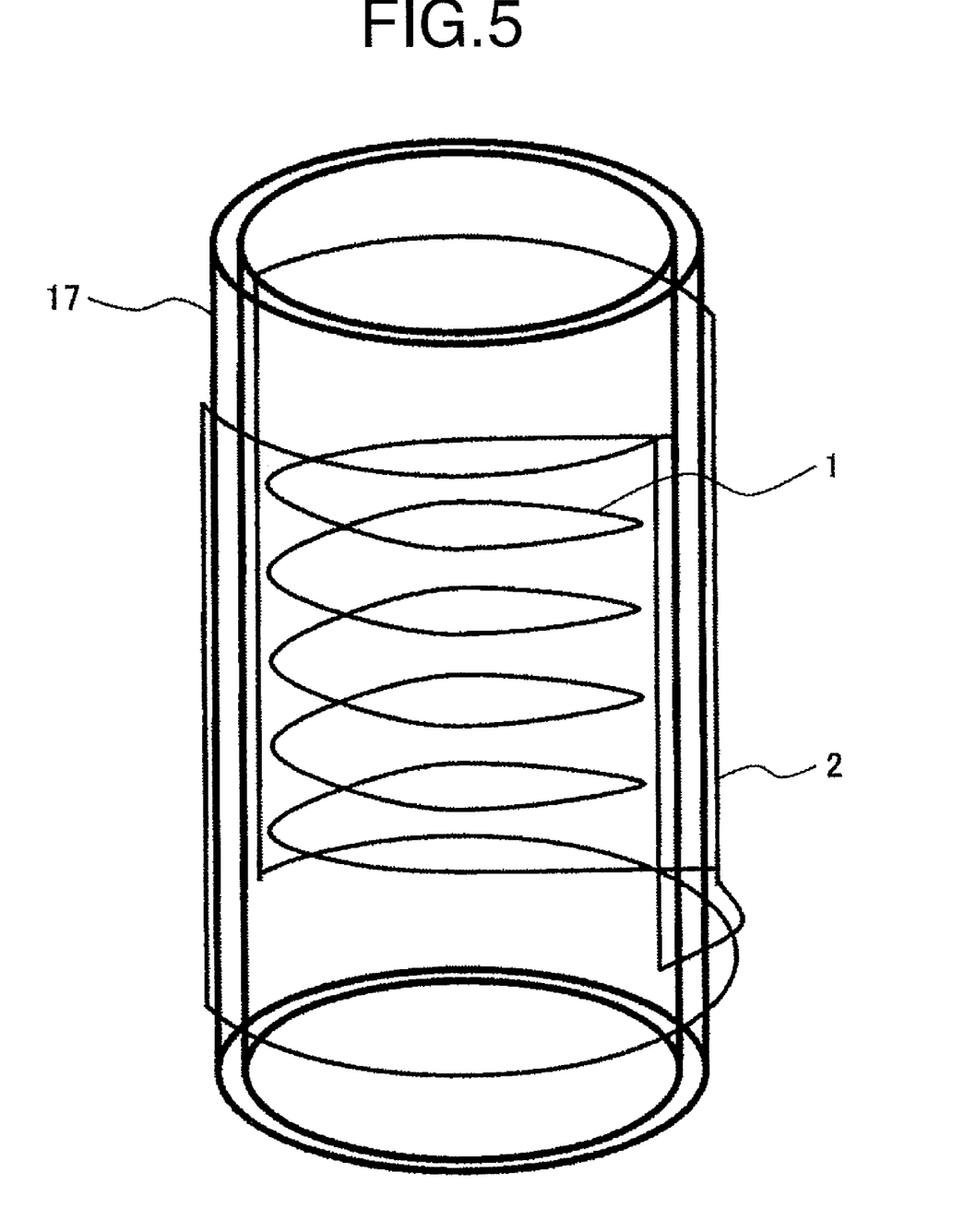
FIG. 5 is a perspective diagram showing a detailed layout of a transmission coil and a receiving coil.

In the probe coil, as FIG. 5 shows, the receiving coil desirably has the shape of a solenoid, while the transmission coil desirably has the shape of a saddle. This helps make the most of a characteristic of the transmission and reception separation type.

The solenoid shaped transmission coil causes the sample to couple to magnetization relatively strongly, thus having excellent detection efficiency. In contrast, the saddle shaped receiving coil is excellent in uniformizing the irradiated magnetic field. It is possible to incline nuclear spins with the same strength in an effective detection region of the solenoid shaped receiving coil by setting the height of the saddle shaped transmission coil higher than that of the solenoid shaped transmission coil. This is effective in every NMR measurement including the measurement of organic materials and structural analysis of complex protein materials.

The resonance frequency and impedance of the receiving coil are matched by the tuning and matching circuit 4 for reception, and the receiving coil is connected to a preliminary amplifier 10 which has an excellent noise figure. The preliminary amplifier is also cooled to a low temperature to improve the noise figure.

The resonance frequency and impedance of the transmission coil are matched by the tuning and matching circuit 3 for transmission, and the transmission coil is connected to a transmitter 7. The transmitter 7 serves as a kW-class radio-frequency power amplifier.

The transmission coil and receiving coil are coupled through a spacer 17 in order to decide the relative position of the two coils as accurately as possible. In FIG. 5, the solenoid shaped receiving coil 1 is disposed inside the cylindrical spacer 17 to contact the spacer, while the saddle shaped transmission coil 2 is disposed outside the spacer to contact the spacer. Moreover, the height of the transmission coil 2 is set to be higher than that of the receiving coil 1.

The spacer is connected to the heat exchanger and also serves as a heat transfer path. The material of the spacer is desirably selected from those that have electrical insulating properties and good thermal conductivity in a low temperature at which the coils are cooled. Since the frequency of the NMR signal ranges from several tens of MHz to several hundreds of MHz, it is necessary to reduce high frequency loss in the space around the coils in order to enhance the Q value of the receiving coil. Therefore, a material is desirably used in which dielectric loss in that frequency band is small. A sapphire ($Al_2O_3$), an aluminum nitride (AlN), a silicon carbide (SiC), a silicon nitride ($Si_3N_4$) and the like are considered as candidates for the material of the spacer.

It is contemplated that the receiving coil is of a shape wound around a cylindrical bobbin or a shape formed on a planar board as a thin film. Both shapes would enable the implementation of a receiving coil with good reception efficiency. Therefore, the shape of the receiving coil can arbitrarily be selected.

The transmission and reception separation type probe coil poses a problem of an electromagnetic coupling between the transmission coil and the receiving coil. Since both coils resonate at the same frequency, even a small coupling would cause a remarkable influx of energy, resulting in deterioration of the sensitivity inherent to the receiving coil. One of the measures that can be taken so as to reduce the electromagnetic coupling between the transmission coil and receiving coil is to cause the directions of the magnetic fields formed when each coil is energized to be perpendicular with each other and thereby minimize the flux linkage. However, it is quite difficult to perfectly eliminate the coupling between the two coils, because the degree of the coupling between the two coils can be recognized only while they are cooled. Even if the coupling could be eliminated at an ambient temperature, the material contracts when it is cooled, and therefore positional relationship changes. As a result, after cooling, the coupling appears again. Since both the transmission coil and receiving coil are disposed in vacuum while they are cooled, even if an attempt is made to fine-tune the disposition, the coils cannot be easily touched. Furthermore, in order to cool the probe coil substantially stably, the coil and spacer as a heat transfer path must be securely fastened.

The present invention solves the problem of sensitivity reduction due to the coupling by destroying the resonance balance on the side of the transmission coil during transmission. Therefore, in FIG. 1, a superconductor bridge 11 is inserted in electrically parallel with the transmission coil 2. The superconductor bridge is disposed on a substrate 13 and is electrically connected to a lead line 12 of the coil. The superconductor bridge 11 can switch to an open state during transmission and to a short-circuit state during reception. The switching by the superconductor bridge is achieved as described below.

Figure 3:
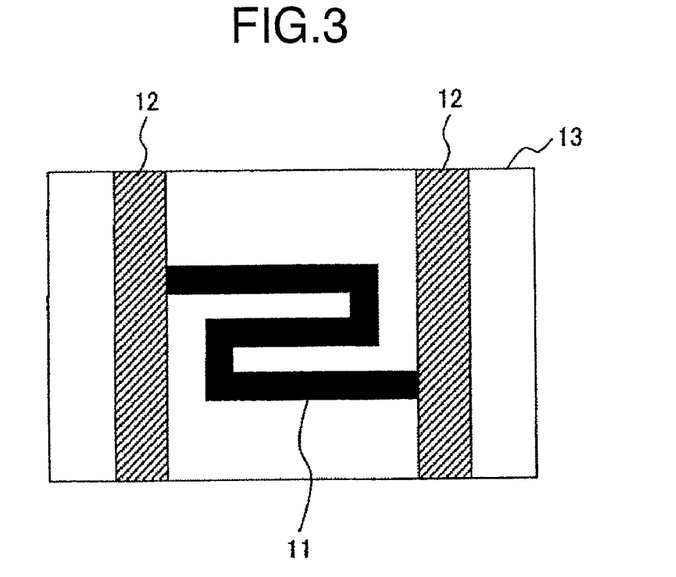
FIG. 3 is a schematic diagram showing an exemplary superconductor bridge.
Figure 4:
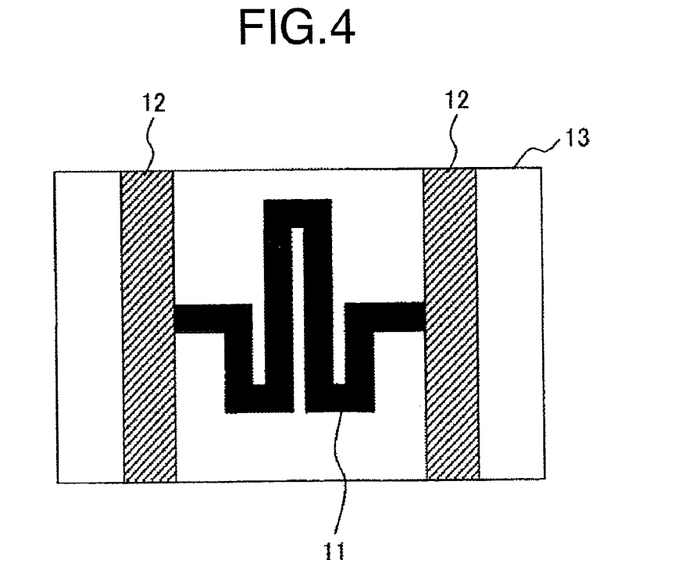
FIG. 4 is a schematic diagram showing another example of the superconductor bridge.

In the NMR measurement, there is a characteristic that the size of a signal during transmission significantly differs from that of a signal during reception. During transmission, the signal strength is about several W to several tens of W, and during reception, it is about μW at most. Therefore, a threshold value may be provided therebetween and the critical current of the superconductor bridge may be set such that the switch is switched in a passive manner. The critical current of the bridge serving as the threshold for switching the switch may be about 1 mA. Furthermore, electrical resistance in an OFF state is set to be several hundreds Ω. The setting of the critical current and electrical resistance can be made according to the cross section and length of the bridge. The larger the sectional section of the bridge is, the larger the critical current becomes. The smaller the cross section of the bridge is and the longer the path of the bridge is, the longer the electrical resistance becomes. The shape of the bridge is decided to minimize the inductance. The wider and shorter the bridge is, the more the inductance can be minimized. It is preferable that a material having high critical current density is employed for the superconductor bridge, and that the superconductor bridge is formed in a short shape with a flat cross section. For example, it is possible to achieve a desired critical current and resistance with a thin film shape of magnesium diboride having a thickness of about 0.4 μm, a width of about 0.1 mm, and a length of about 10 mm. Moreover, it would be better that the bridge has a shape, as shown in FIGS. 3 and 4, in which a generated magnetic field in the shape of a meander or the like is cancelled and inductance is reduced, rather than a simple straight shape. In FIGS. 3 and 4, an interval between round trip lead lines 12 is connected by a long distance rather than by a simple straight line. Since the generated magnetic field is cancelled by portions adjacent to each other of the meandering line, it is possible to make the inductance to be substantially equal to that when the interval is connected by the straight line. This enables both ends of the coil to be connected with low impedance even in the high frequency signal and connected with higher resistance during switching off, thus providing an excellent switch.

Figure 6:
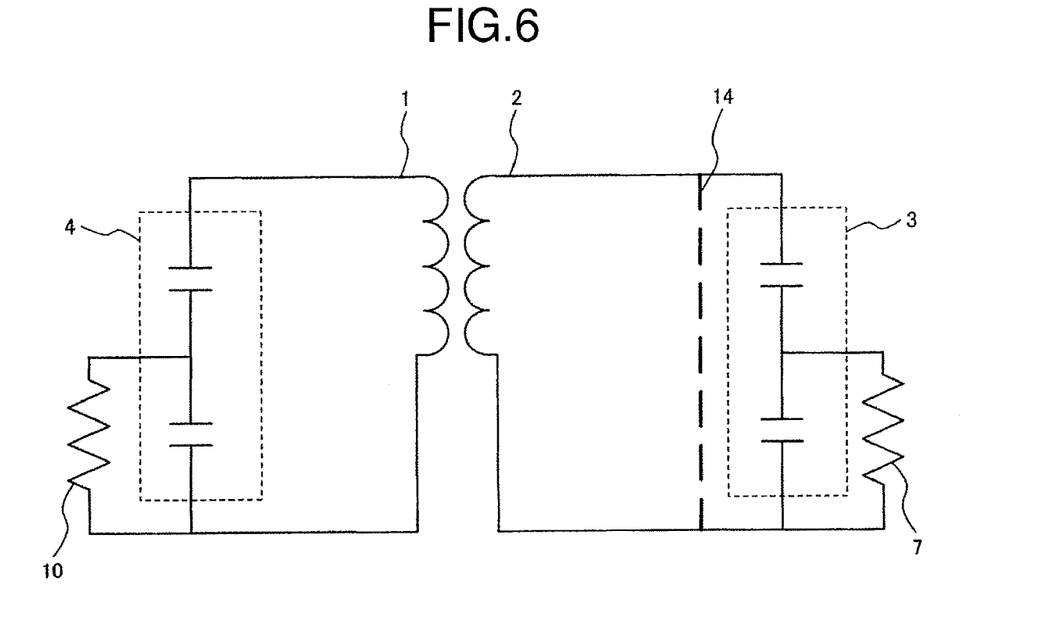
FIG. 6 is a circuit diagram showing an equivalent circuit during irradiation.

FIG. 6 shows an equivalent circuit during transmission in which the switch using the superconductor bridge is in an open state. Since it is in an open state 14, the switch can be neglected from the viewpoint of circuit operation. At this time, the circuit operates as a typical transmission and reception separation type probe coil. Current flowing to a path for transmission, which is a resonance path, produces a magnetic field and irradiates a sample with the high frequency magnetic field. Since the transmission coil and receiving coil are slightly coupled at this time, current also flows to the receiving coil. However, since the Q value of the transmission coil is smaller than the Q value of the receiving coil, the characteristic of the circuit is not deteriorated, thus posing no problem to the transmitting capabilities. Since the current flowing to the receiving coil is large, there is a possibility that a large signal may be inputted to the preliminary amplifier 10 disposed at a subsequent stage of the reception circuit to break it. However, this can be avoided by disposing a protection circuit which employs a diode or the like.

Figure 7:
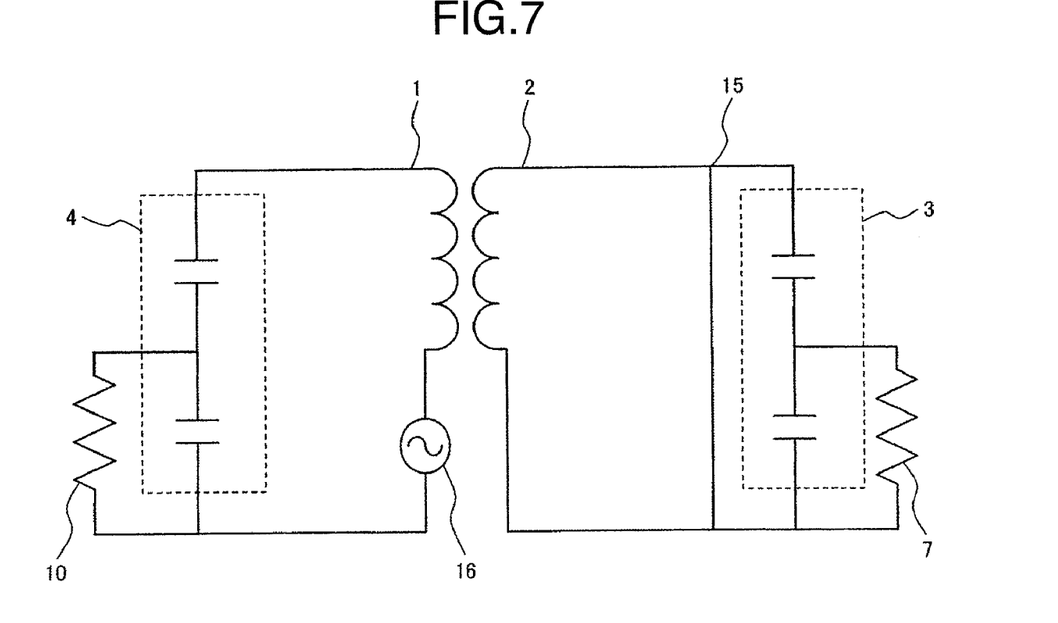
FIG. 7 is a circuit diagram showing an equivalent circuit during reception.

FIG. 7 shows an equivalent circuit during reception in which the bridge causes the switch to be in a short-circuit state. At this time, while the reception circuit is in a resonance state, the receiving coil is in a short-circuit state 15 in which both ends of the coil are short-circuited. Therefore, resonance may not occur, or may occur at a frequency largely deviated from the target frequency. When the bridge is not provided, a signal flows into the reception circuit from the transmission circuit during reception. As a result, the sensitivity inherent to the reception circuit is reduced. However, according to the structure having the bridge described in the present embodiment, the resonance on the side of the transmission circuit is destroyed, and thereby the influx of signals is significantly reduced.

A more detailed description will be provided in the following. When the receiving coil detects a signal, a voltage is induced across the receiving coil and current flows to the receiving coil. At the receiving coil, an electromotive force 16 is occurring that is induced by rotating magnetization of the sample. The reception circuit is in a resonance state, and has very low impedance or only a resistance component. The power consumed by the current flowing to the resistance component at this time is a signal to be observed. Taking a look at the magnetic coupling between the receiving coil and the transmission coil at this time, the two coils behave as a transformer and a voltage is induced to the transmission coil according to the degree of the voltage and coupling occurring at the receiving coil. Since both ends of the transmission coil are currently short-circuited by the superconductor bridge, the resonance frequency of the transmission circuit is deviated from the nuclear magnetic resonance frequency of the target signal and is felt to have very high impedance for the nuclear resonance frequency of the detected signal. Accordingly, little current can flow, and only a little power is wasted by the reception circuit. Therefore, it becomes possible to derive detection efficiency inherent to the receiving coil by preventing the waste in the transmission, thus making it possible to obtain higher sensitivity.

Based on a circuit simulation, the effectiveness of the switch when about 10 percent magnetic coupling is assumed to exist is calculated. When the switch using a superconductor bridge is not disposed, approximately 50 percent of reception signals are lost, while when the switch using the superconductor bridge is disposed, the loss of the reception signal is reduced to approximately 4 percent. Compared with the conventional case in which the switch is not provided, the reception sensitivity has been increased by about two times or more.

A probe coil has been manufactured by way of trial and the effectiveness of the switch has been tested by measuring the Q value. When the switch is in an OFF state, both are tightly coupled and the matching of the receiving coil cannot be easily achieved, and thereby the Q value has not been observed like the simulation. In contrast, when the switch is in an ON state, the influence of the transmission coil is eliminated, and the matching can be easily achieved, indicating that the deterioration is limited to approximately 10 percent from the Q value when the transmission coil is not provided.

As seen in the foregoing description, it has been possible to reduce the deterioration of the reception sensitivity due to the coupling, and to enhance the sensitivity of the probe for NMR by inserting a superconductor bridge in parallel with the transmission coil.

Embodiment 2

Figure 8:
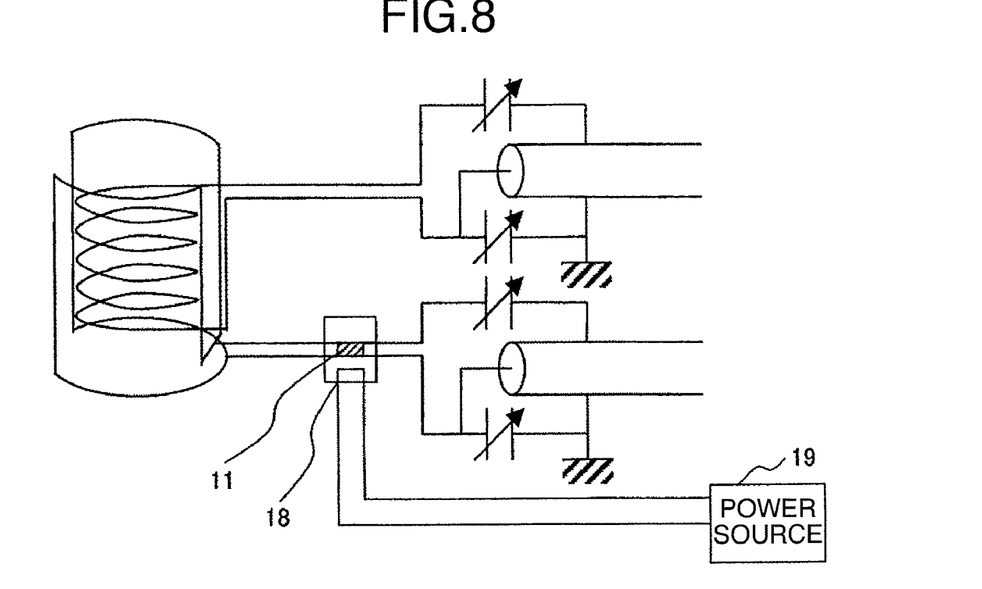
FIG. 8 is a diagram showing another embodiment of the probe according to the present invention.

The structure of a probe according to the present embodiment is shown in FIG. 8. The structure of the present embodiment differs from that of the embodiment 2 in a method of switching the switch, with the rest the same as the structure of the embodiment 1. In the embodiment 1, switching is performed in a passive manner by deciding the current-carrying capacity of the superconductor bridge, while in the present embodiment, the switching ON/OFF is performed by changing the temperature of the superconductor bridge through heating by a heater 18. The heating of the heater is controlled by a direct-current or low frequency power source 19. Sufficient amount of critical current required for reception has only to be secured. However, resistance of several hundreds of Ω has to be secured during an OFF state.

It is difficult to perform both of switching to an ON state and switching to an OFF state at high-speed. However, it is only during reception after transmission, or when switching to an ON state that a high-speed switching operation is required. This is due to a characteristic of NMR measurement. Therefore, design is made such that the high speed switching operation can be performed when switching to an ON state. In order to achieve this, the heater is operated to cause the switch to switch to an ON state only during reception. In order to cause the heater to perform switching at high speed, smaller thermal capacity would be better. To that end, a superconductive material with a critical temperature of 20K or smaller may be employed for the bridge. With the temperature of approximately 20K, the specific heat of the material rises to some extent and temperature controllability is improved. When selecting the superconductive material, it is necessary to consider both an environmental temperature and magnetic field strength. The switch is disposed near the sample and exposed to a strong magnetic field of several T or more. The superconductive material with a temperature of approximately 20K includes magnesium diboride ($MgB_2$), niobium-tin ($Nb_3Sn$), niobium-aluminum ($Nb_3Al$) and the like. It would be better that these materials are employed. A material having thermal conductivity that largely declines at a critical temperature of the superconductor material used for the bridge or lower would be better for the material for a substrate for mounting the switch thereon. When the material satisfying the foregoing condition is heated by a heater, the temperature thereof sharply rises to allow the switch to switch to an OFF state, and when heating is stopped, the temperature of the material returns to the original level to allow the switch to switch to an ON state.

Ceramic materials such a sapphire ($Al_2O_3$), an aluminum nitride (AlN), a silicon carbide (SiC), and a silicon nitride ($Si_3N_4$) are considered as the substrate material. The thermal conductivity for all of these materials sharply declines when their temperatures are dropped at low temperature. Therefore, these materials are excellent in controllability.

The heater is thermally stuck to a surface opposite to the bridge by adhesion or the like. It would be better that the pattern of heater conductor is a noninductive shape that does not produce a magnetic field outside.

As seen in the above, the use of the switch that employs the superconductor bridge and heater enables the problem of coupling between the coils to be solved and the same effect as that of the embodiment 1 to be obtained.

Embodiment 3

Figure 9:
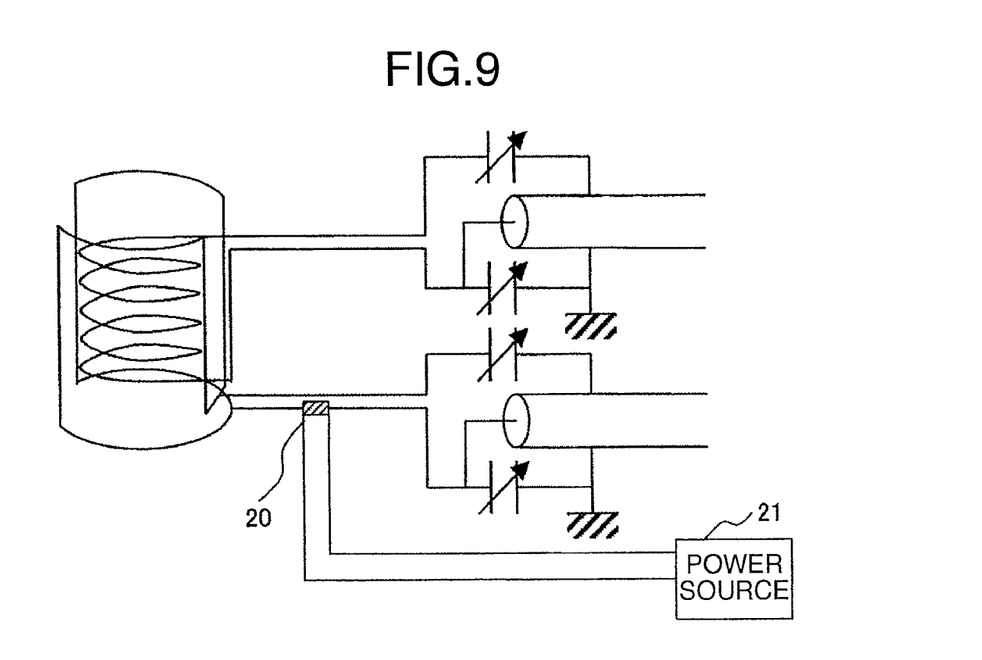
FIG. 9 is a schematic diagram showing the probe of another embodiment according to the present invention.

While the switch is inserted in parallel with the transmission coil in embodiments 1 and 2, the insertion of the switch in series with the transmission would also be capable of solving the problem of coupling between the coils. The structure of the probe according to the present invention is shown in FIG. 9. The method of inserting switching elements in series can be performed by switching using a switch 20 that employs a semiconductor. The switching control of the switch is performed by a power source 21 from outside. A diode element employing a gallium arsenide (GaAs) or a silicon carbide (SiC) for semiconductor switch is desirable considering being cooled by ultra-low temperature.

Direct current is supplied through another channel to cause the switch to operate. It is necessary to consider the capacity of the diode during an OFF state and the resistance of the diode during an ON state. The resistance during the ON state would be better if it is significantly smaller than 1Ω. Since the capacity during the OFF state is typically smaller than 1 pF, a transmission circuit resonates at higher frequency than the resonance frequency during the ON state. Attention should be paid to prevent the frequency that resonates during the OFF state from matching the resonance frequency of another nuclide to be observed.

As described above, it is possible to solve the problems of coil coupling and sensitivity deterioration by inserting a switch made of a semiconductor device in series with the coil.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A probe configured for a nuclear magnetic resonance apparatus, comprising:
   a transmission coil irradiating a sample with a high-frequency electromagnetic wave; and
   a receiving coil detecting a nuclear magnetic resonance signal emitted by the sample,
   wherein said transmission coil is provided with a selector switch made of a superconductor material having a critical temperature equal to or less than 20° K in a magnetic field,
   wherein the transmission coil and the receiving coil are placed in a static magnetic field generated by a magnet, and
   wherein a resonance state is switched by the selector switch.

2. The probe configured for a nuclear magnetic resonance apparatus according to claim 1, wherein said selector switch is inserted in series with the transmission coil.

3. The probe configured for a nuclear magnetic resonance apparatus according to claim 2, wherein said selector switch operates in order to switch to an ON state during irradiation and operates in order to switch to an OFF state during reception.

4. The probe configured for a nuclear magnetic resonance apparatus according to claim 1, wherein said selector switch is inserted in parallel with the transmission coil.

5. The probe configured for a nuclear magnetic resonance apparatus according to claim 4, wherein said selector switch operates in order to switch to an OFF state during irradiation and operates in order to switch to an ON state during reception.

6. The probe configured for a nuclear magnetic resonance apparatus according to claim 1, wherein a resonance frequency and an impedance of a resonance circuit are adjusted by said selector switch.

7. The probe configured for a nuclear magnetic resonance apparatus according to claim 1, wherein said selector switch employs the superconductor switches in a passive manner according to a transmission or reception state using a critical current as a threshold value.

8. The probe configured for a nuclear magnetic resonance apparatus J according to claim 1, wherein said selector switch employs the superconductor switches in an active manner according to a temperature rise caused by heater heating, and wherein switching of said selector switch occurs at a temperature equal to or smaller than 20° K.

9. The probe configured for a nuclear magnetic resonance apparatus according to claim 8, wherein when said heater is in an ON state, said selector switch is in an OFF state, and when said heater heating is in an OFF state, said selector switch is in an ON state, and
wherein during reception, said selector switch is in an OFF state (heater ON), and during irradiation, said selector switch is in an ON state (heater OFF).

10. The probe configured for a nuclear magnetic resonance apparatus according to claim 1, wherein a semiconductor device is employed as said selector switch.

11. A nuclear magnetic resonance apparatus, comprising:
a transmission coil irradiating a sample with a high-frequency electromagnetic wave; and
a receiving coil detecting a nuclear magnetic resonance signal emitted by the sample, wherein said transmission coil is provided with a probe having a selector switch made of a superconductor material having a critical temperature equal to or less than 20° K. in a magnetic field,
wherein the transmission coil and the receiving coil are placed in a static magnetic field generated by a magnet, and
wherein a resonance state is switched by the selector switch.

12. The nuclear magnetic resonance apparatus according to claim 11, wherein a resonance frequency and an impedance of a resonance circuit are adjusted by said selector switch.

* * * * *

UNITED STATES PATENT AND TRADEMARK OFFICE
CERTIFICATE OF CORRECTION

PATENT NO. : 7,609,064 B2
APPLICATION NO. : 11/757453
DATED : October 27, 2009
INVENTOR(S) : Fukuda et al.

It is certified that error appears in the above-identified patent and that said Letters Patent is hereby corrected as shown below:

Title Page, Item (30) Foreign Application Priority Data, should read as follows:

June 5, 2006 (JP) 2006-155971

Signed and Sealed this

Twenty-ninth Day of December, 2009

David J. Kappos
*Director of the United States Patent and Trademark Office*